(12) United States Patent
Jeong (10) Patent No.: US 6,323,558 B1
(45) Date of Patent: Nov. 27, 2001

(54) METHOD FOR FABRICATING A CONTACT OF A SEMICONDUCTOR DEVICE

(75) Inventor: In-Kwon Jeong, Sungnam-shi (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/323,889

(22) Filed: Jun. 2, 1999

(30) Foreign Application Priority Data

Jun. 2, 1998 (KR) .................................................. 98-20363

(51) Int. Cl.[7] .................................................. H01L 29/40
(52) U.S. Cl. .................... 257/774; 257/298; 257/301; 257/304; 438/629; 438/672; 438/675
(58) Field of Search .................................... 257/296, 298, 257/301, 302, 303, 304, 306, 310, 311, 379, 532, 534, 774; 438/605, 625, 627, 628, 629, 642, 652, 666, 672, 675

(56) References Cited

U.S. PATENT DOCUMENTS

5,744,389 * 4/1998 Kim ...................................... 438/253
5,886,411 * 3/1999 Kohyama .............................. 257/774

* cited by examiner

Primary Examiner—Olik Chaudhuri
Assistant Examiner—Ginette Peralta
(74) Attorney, Agent, or Firm—The Law Offices of Eugene M. Lee, PLLC

(57) ABSTRACT

A method of fabricating a contact of a semiconductor memory device to prevent severe necking of a storage node despite misalignment thereof, and thus to prevent the falling-down of the storage node. A portion of a contact hole is filled with a material having an etch selectivity with respect to the storage node above the material and with respect to a conductive layer beneath the material.

6 Claims, 9 Drawing Sheets

METHOD FOR FABRICATING A CONTACT OF A SEMICONDUCTOR DEVICE

BACKGROUND OF THE INVENTION

1. Field of the Invention

The present invention relates generally to a method of fabricating a semiconductor device, and more particularly to a method of fabricating a contact of a semiconductor memory device.

2. Description of the Related Art

Figure 1A:
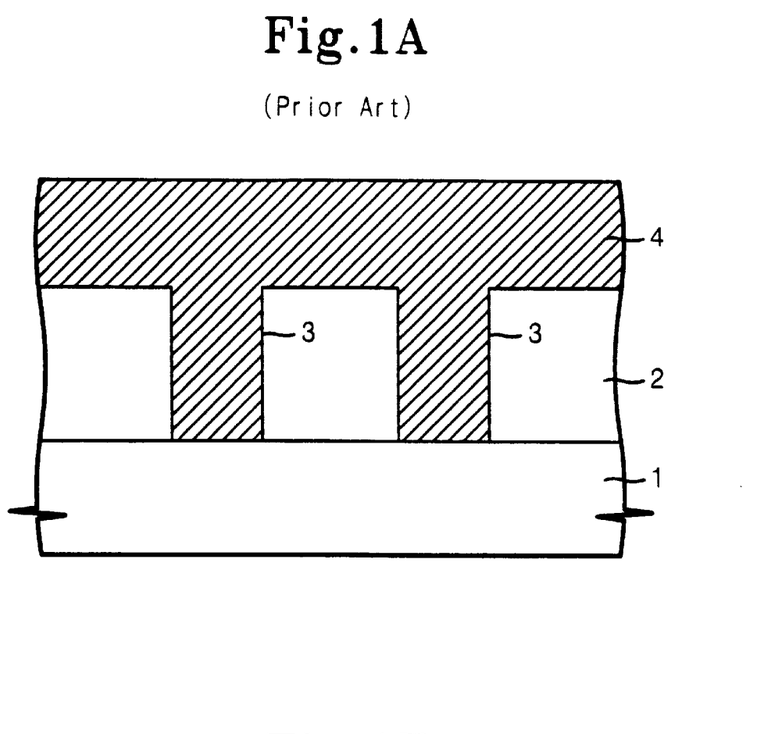
FIGS. 1A and FIG. 1B are cross-sectional views sequentially showing a conventional method of fabricating a semiconductor memory device.
Figure 1B:
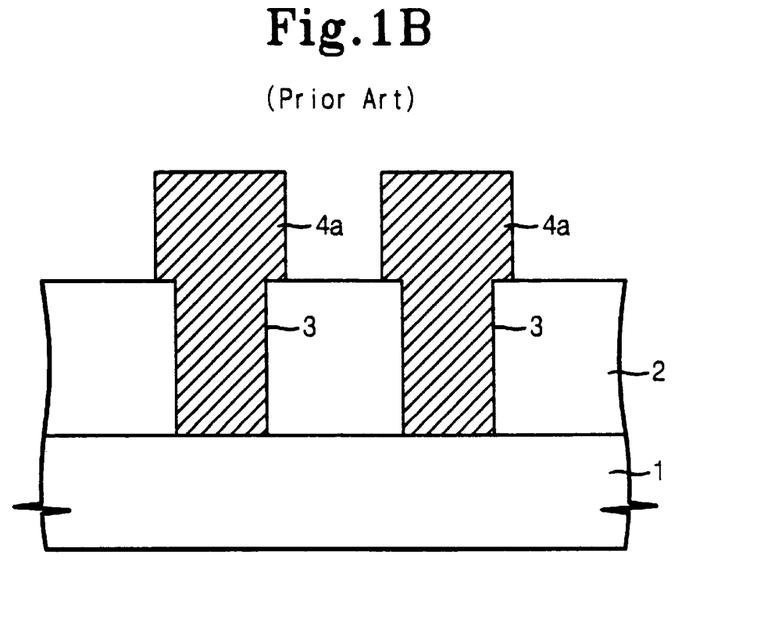

FIGS. 1A–1B sequentially illustrate a conventional method for fabricating a storage node of a semiconductor memory device. A conventional method for fabricating a storage node of a DRAM (dynamic random access memory) cell capacitor includes the following steps, as shown in FIG. 1A. An interlayer insulation film 2 is formed on a semiconductor substrate 1. The interlayer insulation film 2 is etched until an upper surface of a portion of the semiconductor substrate 1 is exposed, so that contact holes 3, that is, storage node contact holes 3, are formed. A conductive layer 4 for forming a storage node, for example, a polysilicon layer, is formed on the interlayer insulation film 2 so as to fill up the contact holes 3.

Figure 2:
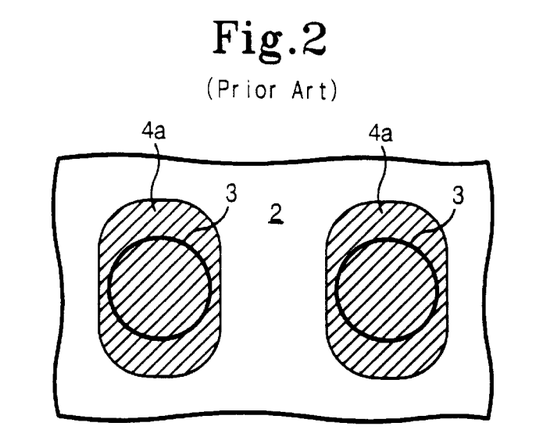
FIG. 2 is a plan projection view of FIG. 1B.

The polysilicon layer 4 is patterned, as shown in FIG. 1B, by using a storage node formation mask (not shown). In this way, storage nodes 4a are formed. FIG. 2 is a plan projection view showing the storage nodes 4a to be correctly aligned with the contact holes 3.

Figure 3:
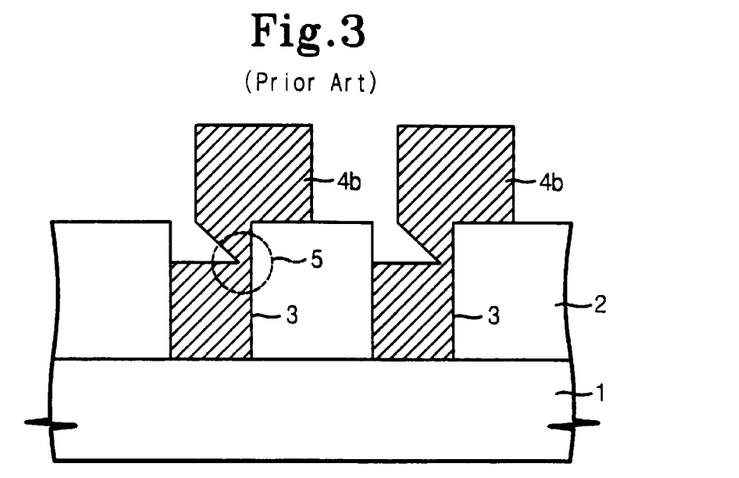
FIG. 3 is a cross-sectional view showing a misaligned storage node, according to the prior art.

If a misalignment between a storage node 4b and a contact hole 3 is generated in a storage node patterning process, as shown in FIG. 3, necking (reference numeral 5) can occur. Necking occurs when a storage node 4b is narrowed by an overetch process which is conventionally performed during a dry etch process for patterning a storage node.

Figure 4:
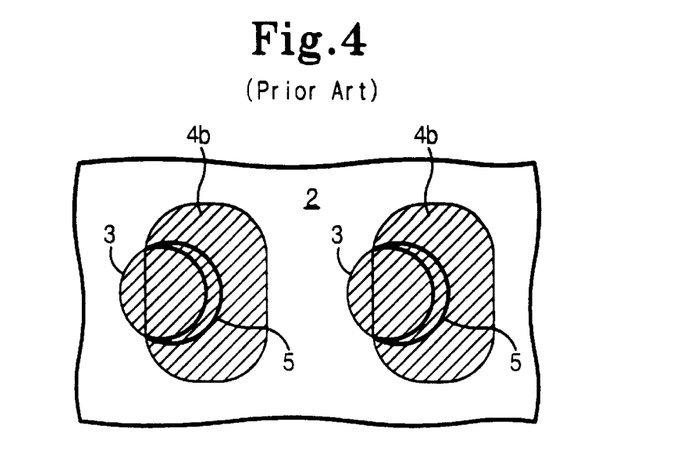
FIG. 4 is a plan projection view of FIG. 3.

FIG. 4 is a plan projection view of FIG. 3. Reference numeral 5 is a connecting section between the storage node 4b and the contact hole 3. If the level of necking is too high or severe, the storage node 4b can fall down or fall off.

The present invention is directed to overcoming or at least reducing the effects of one or more of the problems set forth above.

According to an aspect of the present invention, a semiconductor memory device comprises a semiconductor layer; an interlayer insulation film on the semiconductor layer; a contact hole in the interlayer insulation film, the contact hole penetrating through the interlayer insulation film down to the semiconductor layer; a first material filling a portion of the contact hole; and a contact electrode, including a conductive material, on a portion of the first material, wherein the first material has an etch selectivity with respect to the contact electrode.

According to another aspect of the present invention, a semiconductor memory device comprises a semiconductor substrate; an interlayer insulation film on the semiconductor substrate; a contact hole in the interlayer insulation film, the contact hole penetrating through the interlayer insulation film down to the semiconductor substrate; a contact plug in the contact hole and electrically connected to the semiconductor substrate, the contact plug having an upper surface lower than that of the interlayer insulation film; a first conductive layer covering the upper surface of the contact plug and a sidewall of the contact hole; a material layer pattern inside the contact hole surrounded by the first conductive layer; and a second conductive layer on a portion of the first conductive layer and the material layer.

BRIEF DESCRIPTION OF THE DRAWINGS

The above features and advantages of the present invention will become more apparent by describing in detail a specific embodiment thereof with reference to the attached drawings, wherein.

DETAILED DESCRIPTION OF SPECIFIC EMBODIMENTS

Korean application no. 98-20363, filed Jun. 2, 1998, is hereby incorporated by reference as if fully set forth herein.

When a certain layer is described as being "on" or "above" a second layer or substrate, the certain layer may directly exist on the second layer or substrate and one or more additional layers may be interposed between the certain layer and the second layer or substrate. An analogous definition is intended for the words "below" and "under."

First Embodiment

The present invention will be described in greater detail in conjunction with a specific embodiment by reference to the accompanying drawings.

Figure 5A:
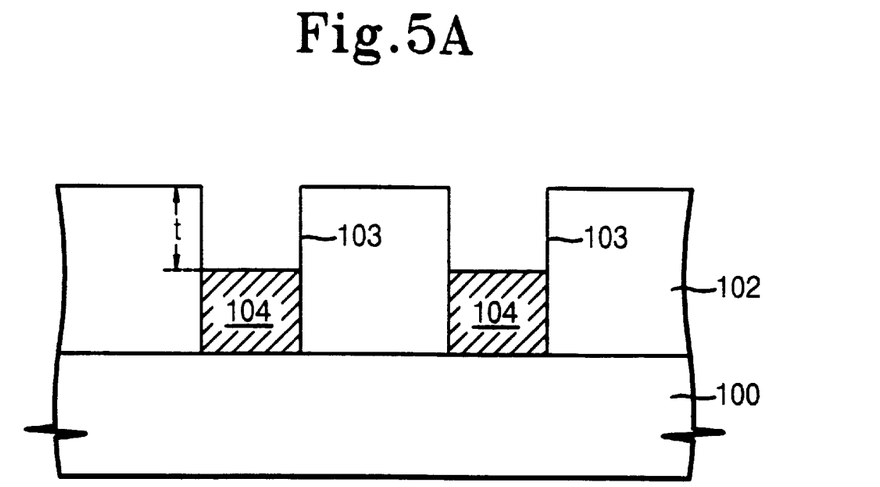
FIGS. 5A–5E are cross-sectional views sequentially showing a novel method of fabricating a semiconductor memory device according to a first embodiment of the present invention.

FIGS. 5A–5E sequentially illustrate a novel method of fabricating a semiconductor memory device according to a first embodiment of the present invention. Referring to FIG. 5A, an interlayer insulation film 102 is formed on a semiconductor substrate 100. The interlayer insulation film 102 is etched by using a photoresist pattern (not shown) formed thereon as a mask. As a result, contact holes 103, that is, storage node contact holes 103, are formed which expose an upper surface of a portion of the semiconductor substrate 100, for example, a portion of an impurity region (not shown). Recessed contact plugs 104 are formed to fill up a portion of the contact holes 103. The recessed contact plugs 104 have a recess depth (t) in the range of from about 100 Å to about 5,000 Å.

The recessed contact plugs 104 are formed in the following manner. A conductive layer is formed on the interlayer insulation film 102 to fill the contact holes 103. The conductive layer is then planarly etched by means of an etch back process. The conductive layer is over-etched so that the upper surface levels of the contact plugs 104 are lower than that of the interlayer insulation film 102. The over-etching recesses the contact plugs 104, and consequently, recessed contact plugs 104 are thereby formed.

Alternatively, after the conductive layer is formed on the interlayer insulation film 102 to fill the contact holes 103, the conductive layer is planarly etched by means of a CMP (chemical mechanical polishing) process. The CMP process is performed until an upper surface of the interlayer insulation film 102 is exposed. Subsequently, a portion of the conductive layer in the contact holes 103 is etched by means of either a wet etch process or a dry etch process, thereby forming the recessed contact plugs 104.

The conductive layer for forming the recessed contact plugs 104 is preferably made of a material selected from the group consisting of silicon (polysilicon), Ti, TiN, W, WN, Al, Cu, Pt, Au, Ag, and all combinations thereof.

Figure 5B:
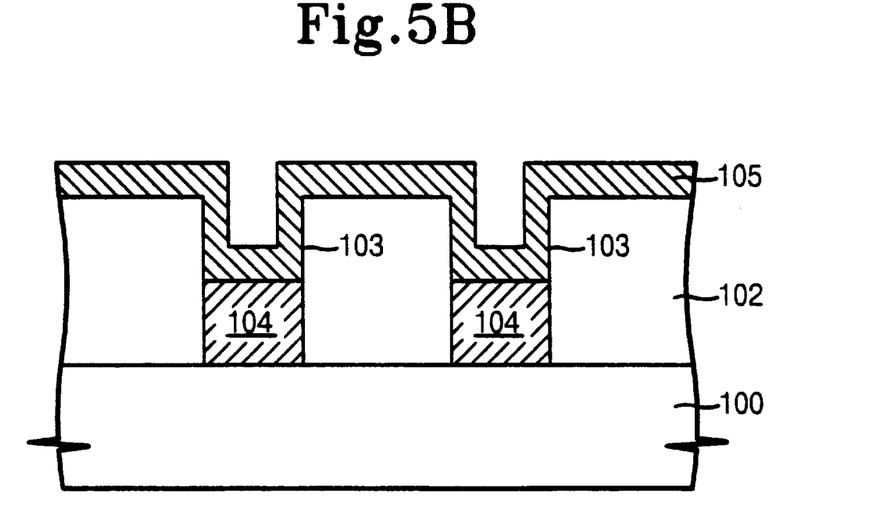

Referring to FIG. 5B, a conductive layer 105, such as a capping layer, which is electrically connected to the recessed contact plugs 104, is formed on the interlayer insulation film 102 and follows the topology of the contact holes 103. The conductive layer 105 is preferably made of a material selected from the group consisting of silicon (polysilicon), Ti, TiN, W, WN, Al, Cu, Pt, Au, Ag, and all combinations thereof. The conductive layer 105 has a thickness in a range from about 100 Å to about 3,000 Å.

Figure 5C:
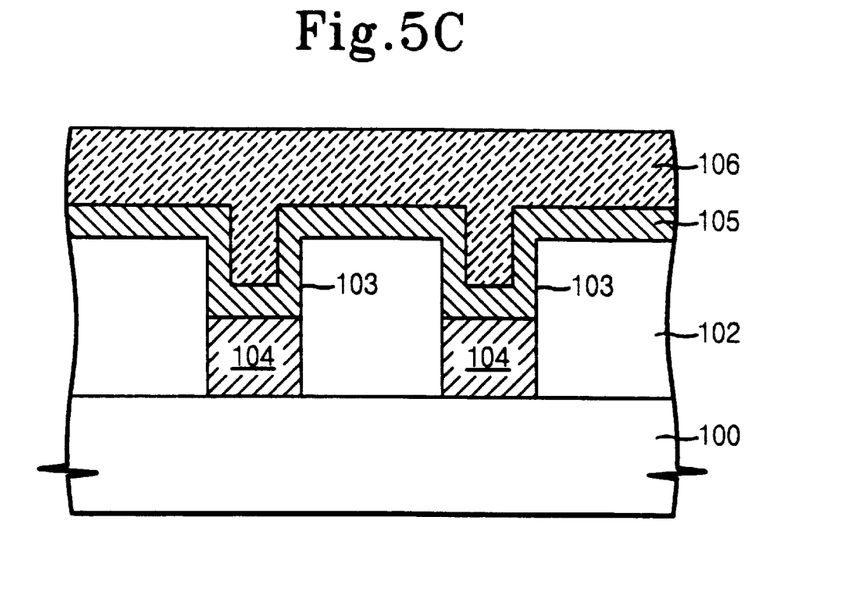

Referring to FIG. 5C, a material layer 106 is formed on the conductive layer 105 to fill up the contact holes 103. The material layer 106 is made of a material having an etch selectivity with respect to the conductive layer 105 and with respect to a storage electrode material (described below). The material layer 106 can be made of either a conductive material or an insulating material.

The material layer 106, such as a silicon oxide layer, may be made of a material selected from the group consisting of BPSG, PSG, $SiO_2$, and Fox (flowable oxide). In addition, the material layer 106 may be made of a material selected from the group consisting of Si—O, Si—O—N, Si—N, Al—O, Al—N, B—N, Ti—N, W—Si, and W—N. This list of materials is not intended to be exhaustive and is intended to be exemplary.

Figure 5D:
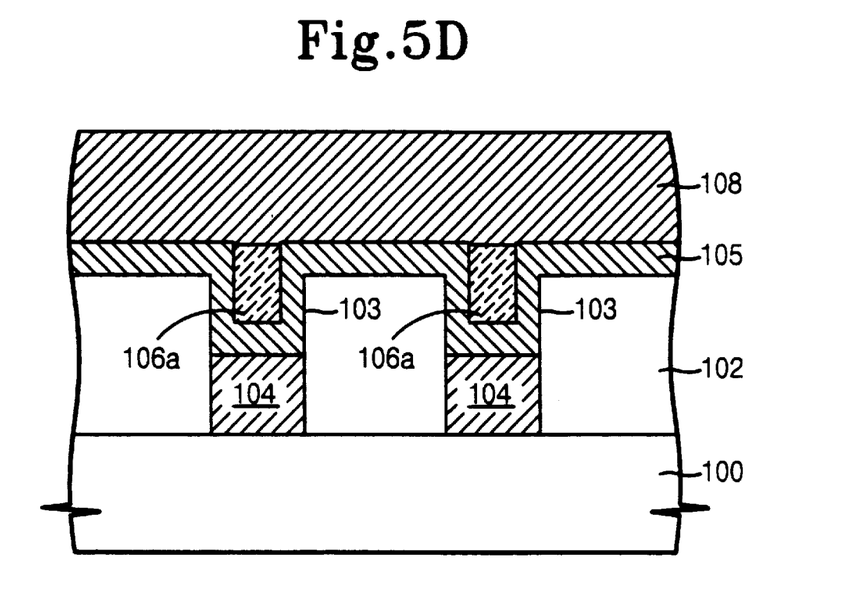

Referring to FIG. 5D, the material layer 106 is planarly etched using, for example, an etch back process until an upper surface of the conductive layer 105 on both sides of each contact hole 103 is exposed. As a result, material layer plugs 106a, for example, silicon oxide layer plugs, are formed. A conductive layer 108, for forming storage nodes, is formed on the conductive layer 105 including the material layer plugs 106a.

The conductive layer 108 is preferably made of a material selected from the group consisting of silicon (polysilicon), Ti, TiN, W, Wn, Al, Cu, Pt, Au, Ag, and all combinations thereof. The recessed contact plugs 104 and the conductive layers 105, 108 are preferably made of polysilicon and the material layer plugs 106a are preferably made of silicon oxide.

Figure 5E:
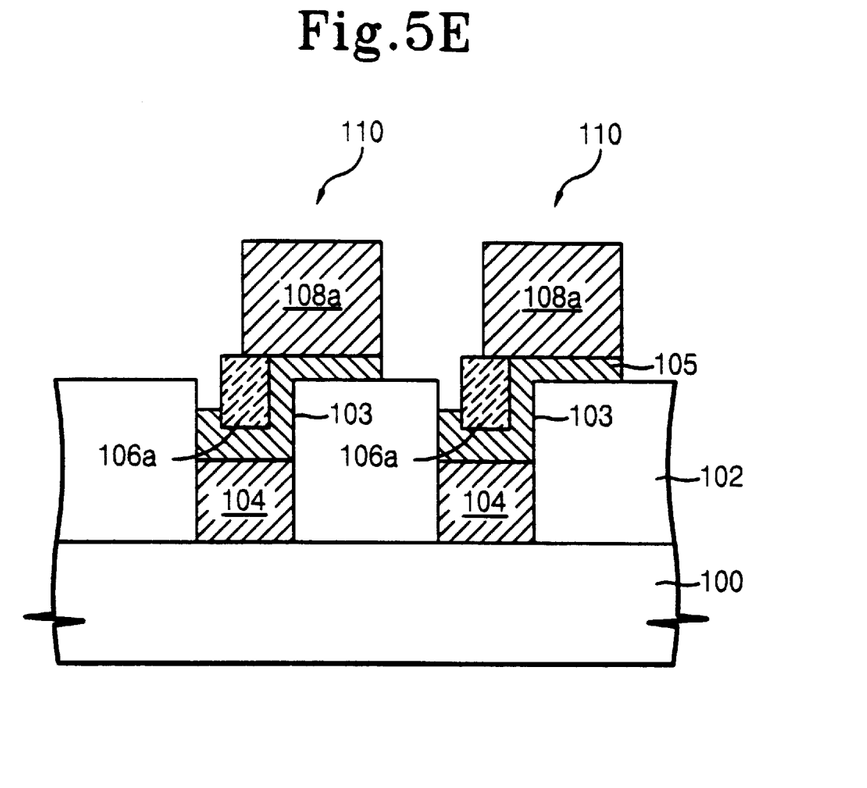

As shown in FIG. 5E, the conductive layer 108 may be patterned by a conventional photolithography process, thereby forming storage nodes 110, such as lower electrodes of DRAM (dynamic random access memory) cell capacitors. In FIG. 5E, the storage nodes 110 are misaligned with the contact holes 103. The misalignment degree is similar to that of a prior storage node 4b, as shown in FIG. 3. However, because the material layer plugs 106a have an etch selectivity with respect to the conductive layers 105, 108, the prior art problems of severe necking is not encountered.

Figure 6:
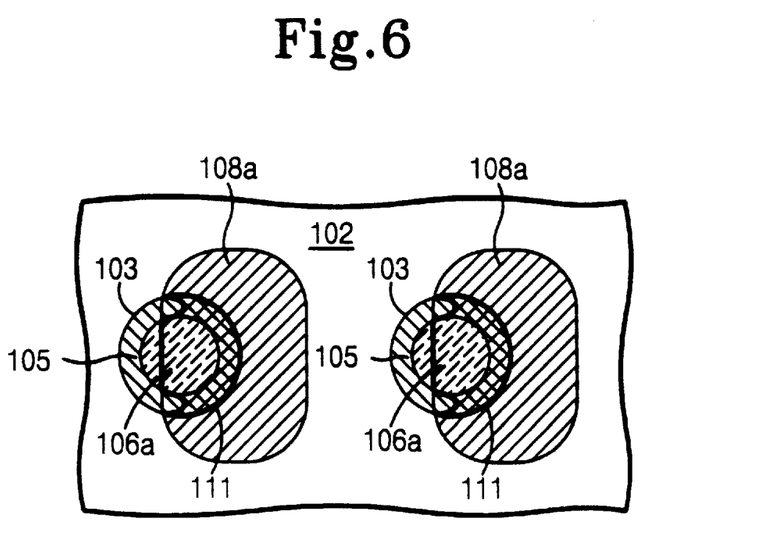
FIG. 6 is a plan projection view of FIG. 5E.

FIG. 6 is a plan projection view of FIG. 5E. Referring to FIG. 6, although storage nodes 110 are misaligned with the contact holes 103, they are supported by the conductive layer 105 and the material layer plugs 106a. Reference numeral 111 identifies the connecting sections between the storage nodes 110 and the contact holes 103. The connecting sections 111 essentially consist of the entire region of overlap between the storage nodes 110 and the contact holes 103. Some etching, however, typically occurs at the boundaries of the conductive layers 105, as shown in FIG. 6.

Considering a connecting area 111 between a storage node 110 and a contact hole 103, a radius of the material layer plug 106a is controlled to obtain a misalignment margin and thus to maintain sufficient contact resistance between the material layer plug 106a and the storage node 110. This is possible by controlling a thickness of the conductive layer 105 formed before deposition of the material layer 106.

Second Embodiment

Figure 7A:
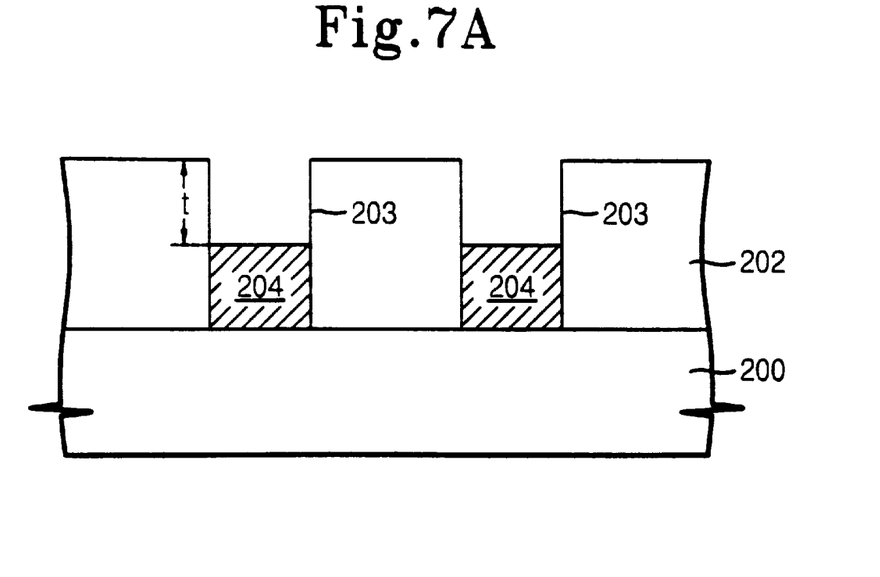
FIGS. 7A–7E are cross-sectional views sequentially showing a novel method of fabricating a semiconductor memory device according to a second embodiment of the present invention.

FIGS. 7A–7E sequentially illustrate a method of fabricating a semiconductor memory device according to a second embodiment of the present invention. Referring to FIG. 7A, an interlayer insulation film 202 is formed on a semiconductor substrate 200. The interlayer insulation film 202 is etched by using a photoresist pattern (not shown) formed thereon as a mask. As a result, contact holes 203, that is, storage node contact holes 203, are formed to expose an upper surface of a portion of the semiconductor substrate 200, for example, a portion of an impurity region (not shown). Recessed contact plugs 204 are formed to fill up a portion of the contact holes 203.

As in the first embodiment, a conductive layer which is formed to fill the contact holes 203 is over-etched by means of an etch back process to form recessed contact plugs 204. Other embodiments may also planarization-etch the conductive layer by means of a CMP (chemical mechanical polishing) process, and then further etch by means of either a wet etch process or a dry etch process, thereby forming recessed contact plugs 204. The recessed contact plugs 204 have a recess depth (t) in a range of from about 100 Å to about 5,000 Å.

The conductive layer for forming the recessed contact plugs 204 is preferably made of a material selected from the group consisting of silicon (polysilicon), Ti, TiN, W, WN, Al, Cu, Pt, Au, Ag, and all combinations thereof.

Figure 7B:
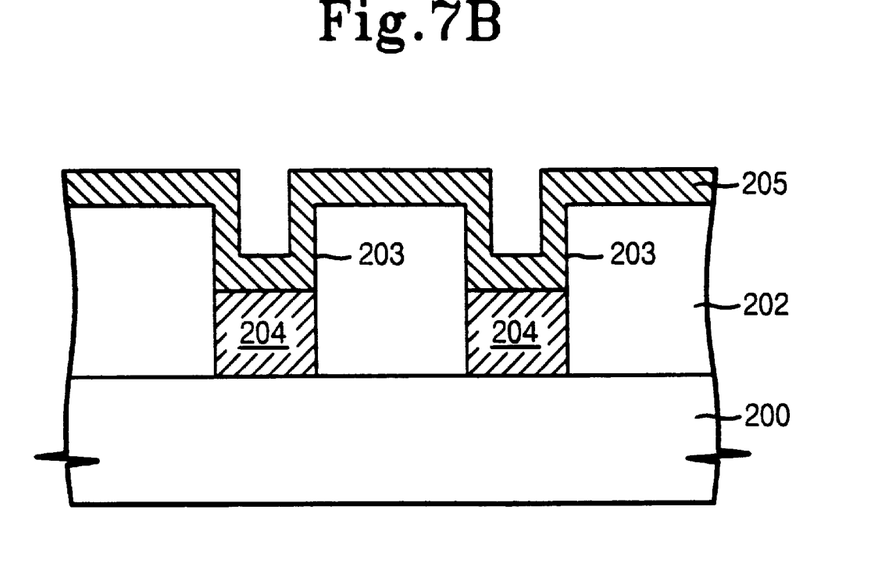

Referring to FIG. 7B, a conductive layer 205, such as a capping layer, which is electrically connected to the recessed contact plugs 204, is formed on the interlayer insulation film 202 and follows the topology of the contact holes 203. The conductive layer 205 has a thickness in a range from about 100 Å to about 3,000 Å and is preferably formed of a material selected from the group consisting of silicon (polysilicon), Ti, TiN, W, WN, Al, Cu, Pt, Au, Ag, and all combinations thereof.

Figure 7C:
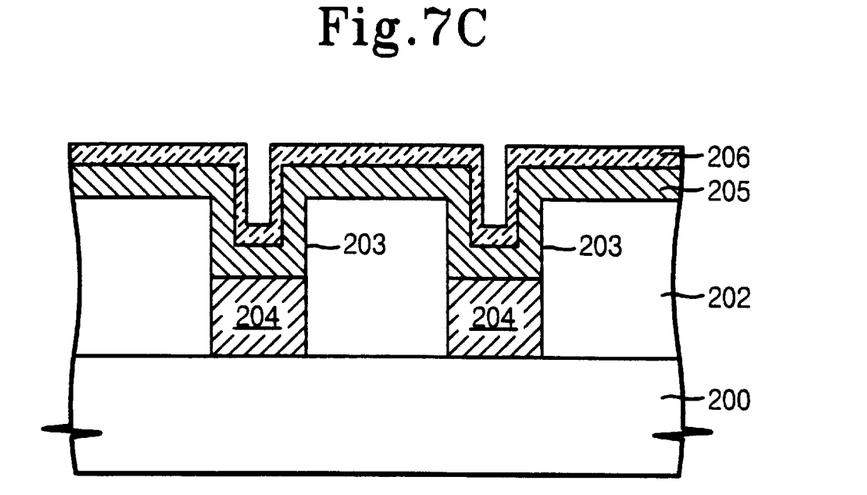

Referring to FIG. 7C, a material layer 206 having an etch selectivity with respect to the conductive layer 205 is formed thereon and follows the topology of the contact holes 203. The material layer 206 is made of either a conductive material or an insulating material. The material layer 206 also has an etch selectivity with respect to a material for forming a storage node (described below).

The material layer 206, such as a silicon oxide layer, is preferably made of a material selected from the group consisting of BPSG, PSG, $SiO_2$, and Fox (flowable oxide). In addition, the material layer 206 may be made of a material selected from the group consisting of Si—O, Si—O—N, Si—N, Al—O, Al—N, B—N, Ti—N, W—Si, and W—N. This list of materials is not intended to be exhaustive and is intended to be exemplary.

Figure 7D:
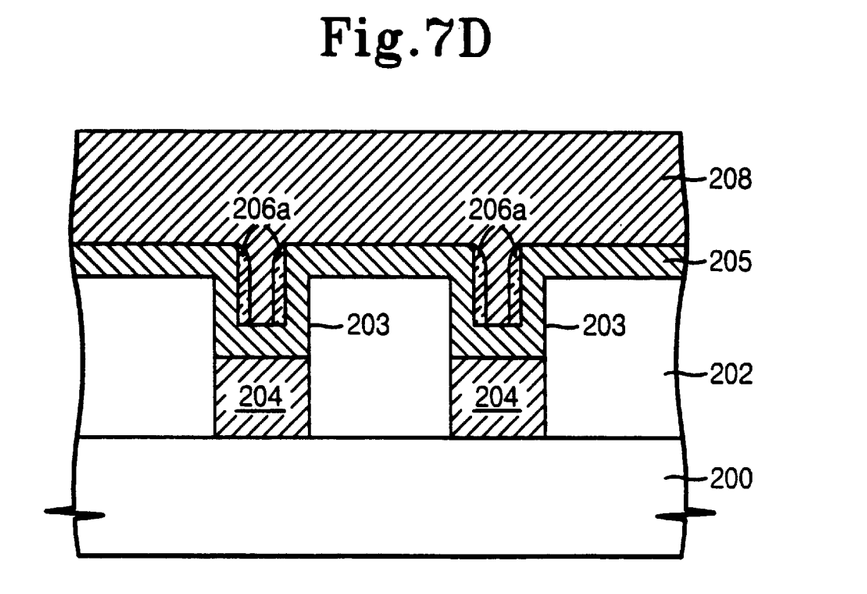

As shown in FIG. 7D, the material layer 206 is etched by means of an etch back process, so that a contact spacer 206a, for example, a silicon oxide spacer, is formed. A conductive layer 208 for forming a storage node is formed the conductive layer 205 so as to fill up the contact hole 203.

The conductive layer 208 is preferably made of a material selected from the group consisting of silicon (polysilicon), Ti, TiN, W, WN, Al, Cu, Pt, Au, Ag, and all combinations thereof. The recessed contact plugs 204 and conductive layers 205, 208 are preferably formed of polysilicon and the contact spacer 206a is preferably made of silicon oxide.

Figure 7E:
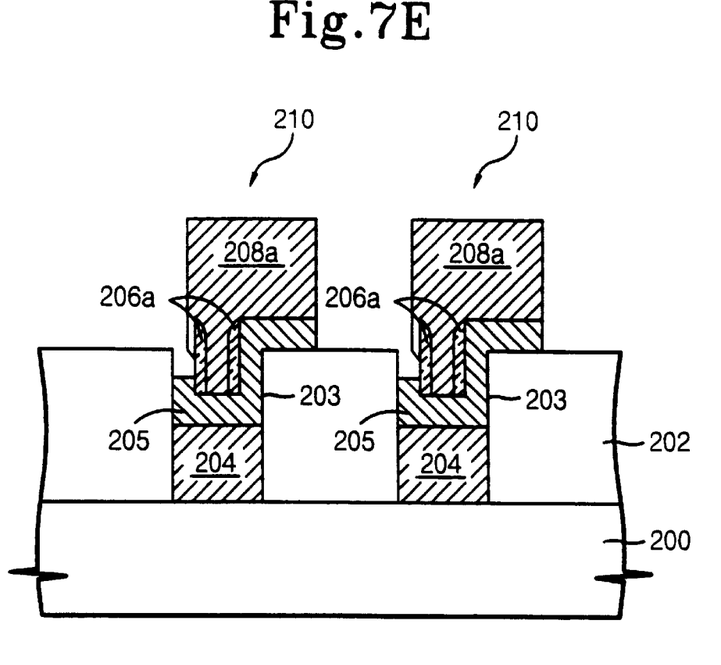

As shown in FIG. 7E, the conductive layer 208 may be patterned by a conventional photolithography process, thereby forming storage nodes 210 such as lower electrodes of DRAM (dynamic random access memory) cell capacitors. In FIG. 7E, storage nodes 210 are misaligned with the contact holes 203. Because the contact spacer 206a has an etch selectivity with respect to the conductive layers 205, 208, the prior art problem of severe necking (see FIG. 3) is not encountered.

Figure 8:
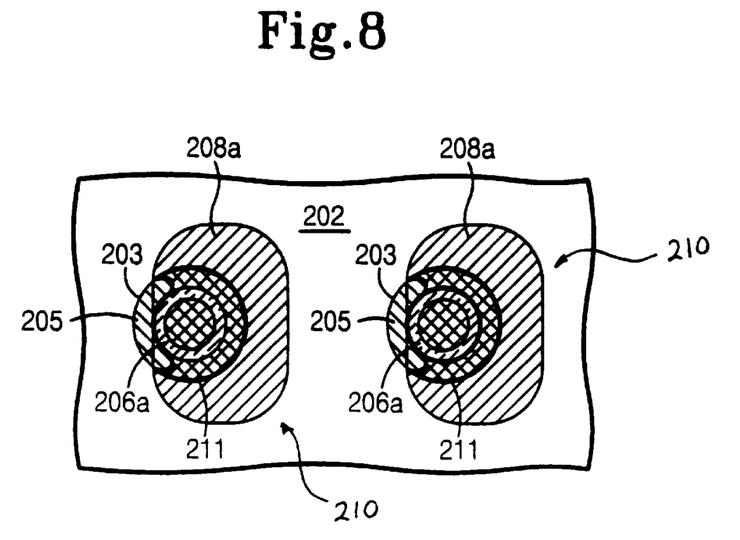
FIG. 8 is a plan projection view of FIG. 7E.

FIG. 8 is a plan projection view of FIG. 7E. Referring to FIG. 8, although a small level of necking may be generated outside the contact spacer 206a, the contact spacer 206a maintains the connection 211 between the storage node 210 and the contact hole 203.

Figure 9:
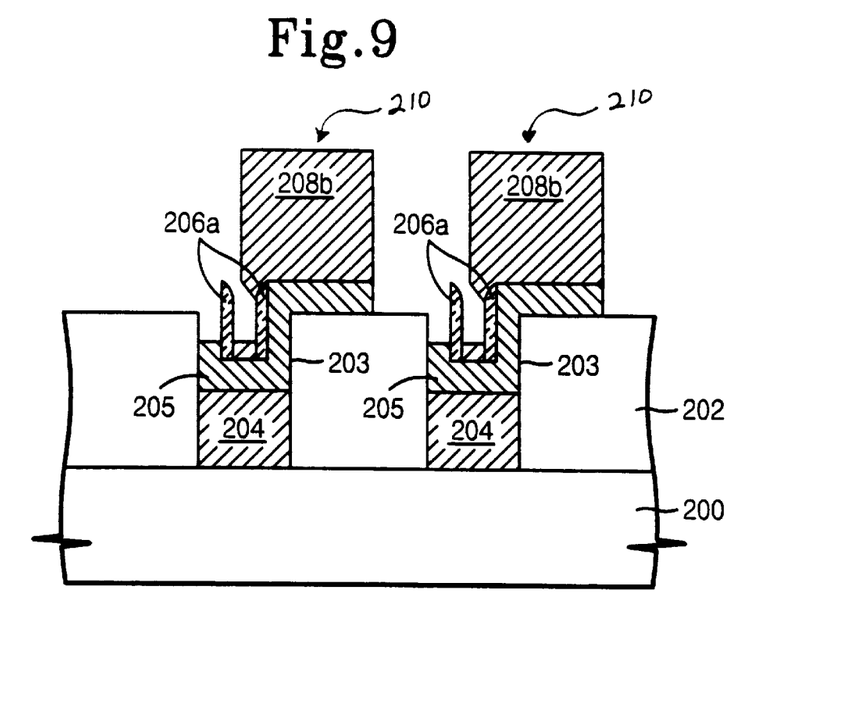
FIG. 9 is a cross-sectional view showing a misaligned storage node according to the second embodiment of the present invention.
Figure 10:
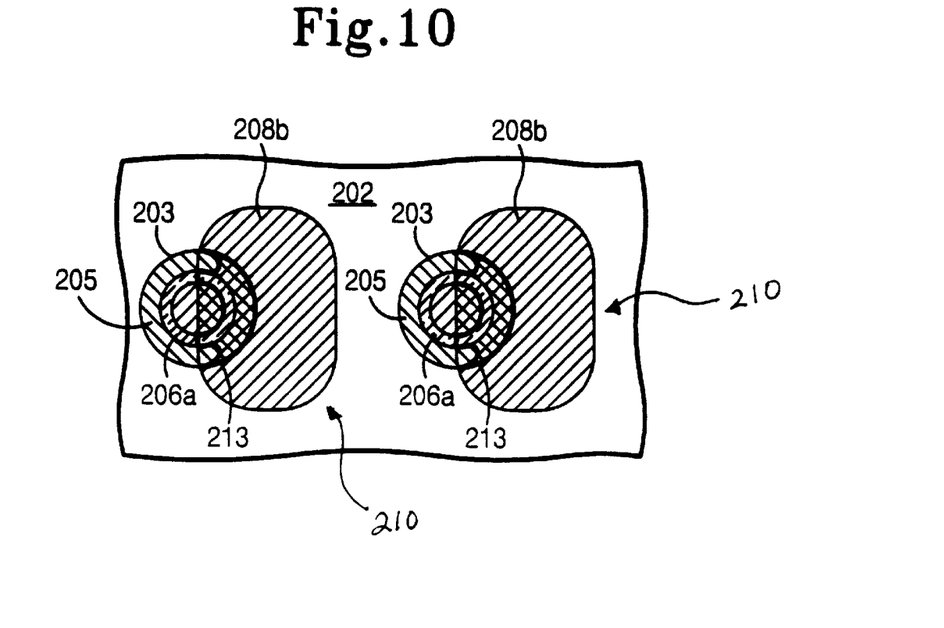
FIG. 10 is a plan projection view of FIG. 9.

As shown in FIG. 9, if misalignment of the storage node 210 and the contact hole 203 is severe during formation of a conductive layer pattern 208b, the necking may also be generated inside the contact spacer 206a. In such a case, the storage node 210 and the contact hole 203 are not directly connected inside the contact spacer 206a. The connection 213 (as shown in FIG. 10) is along the overlapped portion of the contact spacer 206a and along part of the contact hole 203 that is outside this portion.

A thickness and radius of the contact spacer 206a should be properly controlled to prevent necking from occurring inside the contact spacer 206a. The radius of the contact spacer 206a is controlled by controlling a thickness of the conductive layer 205, and the thickness of the contact spacer 206a is controlled by controlling a thickness of the material layer 206, as shown in FIG. 7C.

A portion of a contact hole is filled with a material having an etch selectivity with respect to a storage node, thereby preventing severe necking of the storage node despite misalignment with the contact hole. Thus, the storage node is prevented from falling down.

Referring to FIG. 5E and FIG. 7E, a recessed contact plug 104, 204 is formed. After this formation, a conductive layer 105, 205 electrically connected to the recessed contact plug 104, 204 is formed on an interlayer insulation film 102, 202 and following along the topology of a contact hole 103, 203. The contact hole 103 is then filled up with a material layer 106. The contact hole 203 contains contact spacers 206a formed from side-walls of a material layer 206 that follows the topology of the contact hole 203. The material layers 106, 206 are made of a material having an etch selectivity with respect to the conductive layer 105, 205 and with respect to a conductive layer 108, 208 for forming a following storage node 110, 210. Severe necking of a storage node is prevented despite misalignment thereof with the contact hole. Consequently, the storage node is prevented from falling down.

There has been disclosed a method of fabricating a contact of a semiconductor memory device to prevent severe necking of a storage node despite misalignment with a contact hole.

There has been disclosed a method of fabricating a contact of a semiconductor memory device to prevent a storage node from falling down.

There has been disclosed a method of fabricating a contact of a semiconductor memory device, the method including forming an interlayer insulation film on a semiconductor substrate. The method further includes selectively etching the interlayer insulation film until a portion of the semiconductor substrate is exposed, thereby forming a contact hole therein. The method further includes forming a contact plug in the contact hole, wherein the contact plug connects to the semiconductor substrate and has an upper surface lower than that of the interlayer insulation film. The method further includes forming a first conductive layer on the interlayer insulation film and following the topology of the contact hole, so as to connect electrically to the contact plug. The method further includes filling up the contact hole with a material layer. The method further includes forming a second conductive layer on the first conductive layer including the material layer, and sequentially etching the second and first conductive layers by using a contact electrode formation mask, thereby forming a contact electrode.

There has been disclosed another method of fabricating a contact of a semiconductor memory device, the method including forming an interlayer insulation film on a semiconductor substrate and etching the interlayer insulation film until a portion of the semiconductor substrate is exposed, thereby forming a contact hole therein. The method further includes forming a contact plug in the contact hole, wherein the contact plug connects to the semiconductor substrate and has an upper surface lower than that of the interlayer insulation film. The method further includes forming a first conductive layer on the interlayer insulation film and following the topology of the contact hole, so as to connect electrically to the contact plug. The method further includes forming a contact spacer on the first conductive layer of both side-walls of the contact hole. The method further includes forming a second conductive layer on the first conductive layer to fill up the contact hole, and sequentially etching the second and first conductive layers by using a contact electrode formation mask, thereby forming a contact electrode.

There has been disclosed yet another method of fabricating a contact of a semiconductor memory device. The method includes forming an interlayer insulation film on a semiconductor layer. The method further includes etching the interlayer insulation film until a portion of the semiconductor layer is exposed, thereby forming a contact hole therein. The method further includes filling a portion of the contact hole with a first material. The method further includes forming a conductive layer on the interlayer insulation film and on the contact hole, wherein the first material has an etch selectivity with respect to the conductive layer. The method further includes etching the conductive layer, thereby forming a contact electrode.

There has been disclosed a semiconductor memory device. The device includes a semiconductor layer, an interlayer insulation film, a contact hole, a first material, and a contact electrode. The interlayer insulation film is on the semiconductor layer. The contact hole is formed in the interlayer insulation film such that the contact hole penetrates the interlayer insulation film down to the semiconductor layer. The first material fills a portion of the contact hole. The contact electrode is formed from a conductive material and is formed on at least a portion of the first material. The first material has an etch selectivity with respect to the contact electrode.

Although the forgoing includes description in detail, it is clearly understood that the same is by way of illustration and example only and that the invention is not limited to the particular forms disclosed. Rather, the invention covers all modifications, equivalents, and alternatives falling within the spirit and scope of the present invention and is limited only by the terms of the appended claims.

What is claimed is:

1. A semiconductor memory device comprising:
   a semiconductor substrate;
   an interlayer insulation film on the semiconductor substrate;
   a contact hole in the interlayer insulation film, the contact hole penetrating through the interlayer insulation film down to the semiconductor substrate;
   a contact plug in the contact hole and recessed from a top surface of the interlayer insulation film and electrically connected to the semiconductor substrate, so that the contact plug has an upper surface lower than that of the interlayer insulation film;
   a first conductive layer covering the upper surface of the recessed contact plug and a sidewall of the contact hole;
   a material layer pattern on the first conductive layer; and
   a second conductive layer on a portion of the first conductive layer and the material layer pattern.

2. The device according to claim 1, wherein the material layer pattern forms contact spacers on sidewalls of the first conductive layer in the contact hole, and the second conductive layer fills a region surrounded by the contact spacers.

3. The device according to claim 1, wherein the material layer pattern has an etch selectivity with respect to the first and second conductive layers.

4. The device according to claim 1, wherein the material layer pattern fills the contact hole, and the second conductive layer is on the material layer pattern.

5. The device according to claim 1, wherein the first conductive layer is on a portion of the interlayer insulation film beyond the contact hole, and the material layer pattern has a top surface at a same level as that of the first conductive layer.

6. The device according to claim 1, wherein the first material layer pattern has an etching selectivity with respect to the second conductive layer pattern to prevent necking of the second conductive layer beyond the portion of the first material layer.

* * * * *